Nov. 13, 1962 L. P. NAHAY 3,064,142
AUTOMATIC VARIABLE IMPEDANCE NETWORK FOR USE IN CHANGING
THE TIME CONSTANT OF A PHASE COMPARATOR
Filed Jan. 17, 1958

INVENTOR.
LAWRENCE P. NAHAY
BY F. A. Rechif
ATTORNEY

United States Patent Office 3,064,142 Patented Nov. 13, 1962

3,064,142

AUTOMATIC VARIABLE IMPEDANCE NETWORK FOR USE IN CHANGING THE TIME CONSTANT OF A PHASE COMPARATOR

Lawrence P. Nahay, Haddonfield, N.J., assignor to Radio Corporation of America, a corporation of Delaware Filed Jan. 17, 1958, Ser. No. 709,624
5 Claims. (Cl. 307—88.5)

Figures 1, 2, 3:
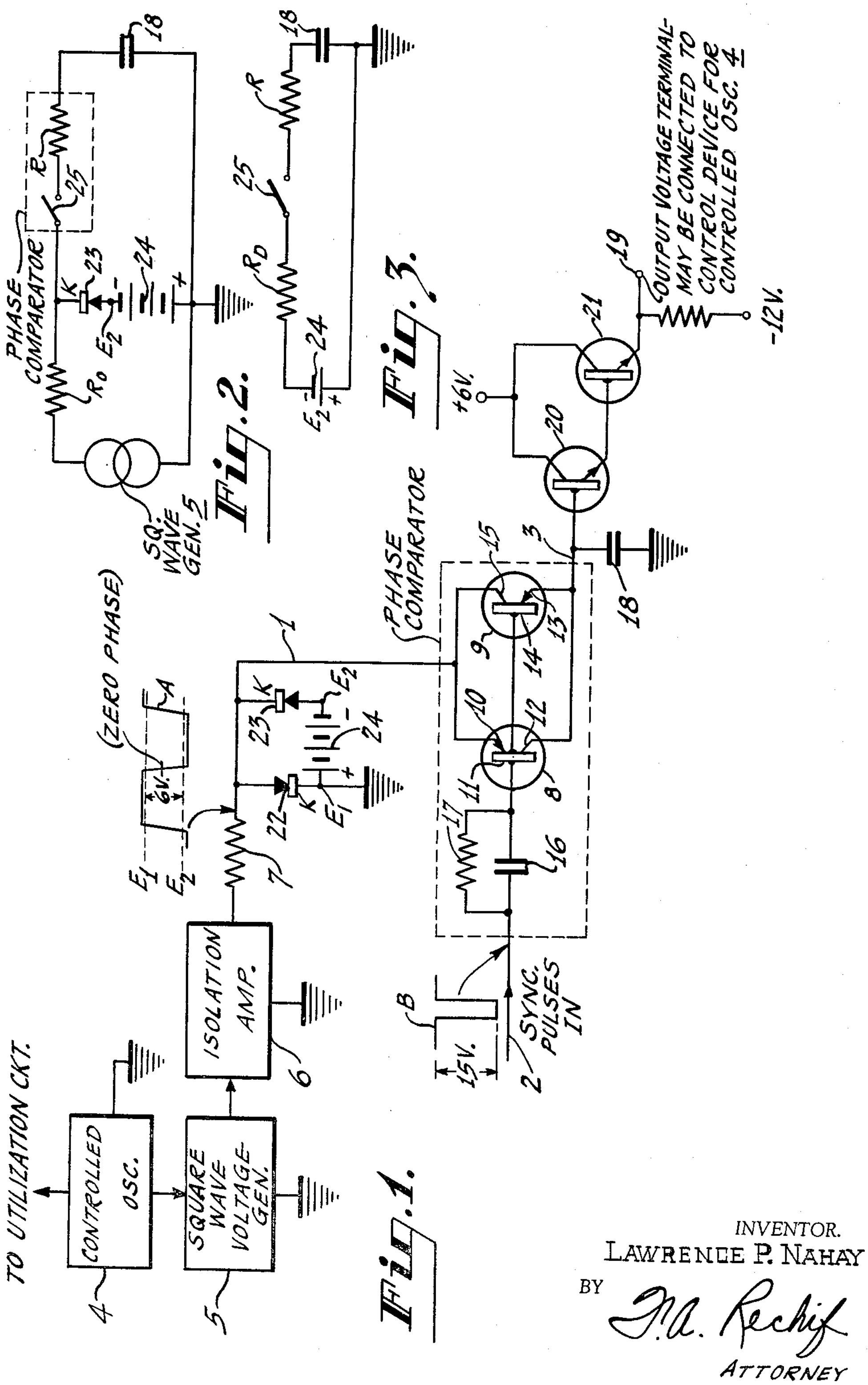

This invention relates to a variable impedance network, and more particularly to a network for charging a capacitor from an alternating current source the effective impedance of which varies with the instantaneous value of the alternating current.

An automatic phase control (sometimes termed an automatic frequency control or AFC) loop for an oscillator ordinarily comprises, in addition to the oscillator to be controlled, an error detecting device (e.g., a phase comparator) to which are supplied a standard or reference frequency signal and a signal representative of the controlled oscillator output, and a frequency controlling or frequency governing device (e.g., a reactance tube) receptive of the error signal from the error detecting device and operating to control the oscillator frequency.

For such a loop, it is desirable that the phase comparator have a short time constant, this being desirable when the phase error between the controlled oscillator wave form and standard frequency waveform is large. This short time constant allows fast action to take place around the loop (which might be thought of as a broad bandwidth for the loop), so that the controlled oscillator is rapidly brought from its initial condition of large phase error (or large frequency error) to a zero-phase-error condition, at which lock-in may take place.

Likewise, in such a loop, it is desirable that the phase comparator have a long time constant, this being desirable when the phase error is zero, under locked conditions. This long time constant allows the loop to respond only relatively slowly (which might be thought of as equivalent to a narrow bandwidth for the loop), providing the desirable result that, when the controlled oscillator is locked in, the control loop is quite insensitive to short-time disturbances (e.g., noise pulses) which might be applied thereto, or to short-time losses of the standard or reference frequency signal (which may be received from a remote point via radio and which may comprise synchronizing pulses of short length or duration).

The two desiderata previously stated (a short time constant, on the one hand, and a long time constant, on the other hand) are seemingly inconsistent, and in the prior art some sort of a compromise has been necessary, in the majority of cases.

An object of this invention is to provide a source of alternating voltage for charging a capacitor, the effective source impedance being varied automatically in a prescribed manner.

Another object is to provide a phase comparator the resistance-capacitance (RC) time constant of which is varied automatically, in a desired manner.

A further object is to provide, in an automatic phase controlled oscillator loop, a phase comparator whose time constant is short when the phase error of the controlled oscillator is large and whose time constant is long when the phase error of such oscillator is zero, that is, under locked conditions.

Still another object is to provide a variable impedance charging circuit for a capacitor, in which the impedance is automatically caused to vary to a substantial extent in a periodic manner.

The objects of this invention are accomplished, briefly, in the following manner, in the particular embodiment hereinafter described: A switching-type phase comparator having two inputs and an output, has a storage capacitor connected across its output. Switching (synchronizing) pulses are supplied to the first input, and a high impedance source of alternating voltage is connected to the second input, thereby to charge the capacitor to a potential equal to the value of the alternating voltage at the instant of closure of the capacitor charging circuit by each switching pulse. A pair of diodes are connected across the second input, one of these diodes being biased to conduct at the negative peaks of the alternating voltage and the other diode being biased to conduct at the positive peaks of the alternating voltage. In this way, a low impedance source of alternating voltage is in effect provided, or a low resistance capacitor charging path is provided, at the times of occurrence of the negative and positive peaks of the input alternating voltage, if the capacitor charging path is completed through the phase comparator at these times. In effect, then, the time constant of the phase comparator is made short at the times of occurrence of the negative and positive peaks of the input alternating voltage. When the diodes are not conductive, the impedance across the second input of the phase comparator remains high.

A detailed description of the invention follows, taken in conjunction with the accompanying drawing, wherein:

FIG. 1 is a combined schematic and block diagram of an arrangement according to this invention; and FIGS. 2 and 3 are simplified, equivalent circuit diagrams useful in explaining the invention.

In order to facilitate an understanding of the present invention, an explanation will first be given of a switching-type phase comparator circuit, with which the present invention is adapted to be used. The phase comparator itself is enclosed in a dotted-line rectangle in FIG. 1, this comparator having two input connections corresponding to leads 1 and 2, respectively, and an output connection corresponding to lead 3.

A substantially continuous alternating voltage, represented by waveform A, is applied to input lead 1 of the comparator, while a periodic series of short reference pulses one of which is illustrated at B is applied to input lead 2 of the comparator. The waveform A is indicated as being a substantially square wave, although it may be a sawtooth wave, sine wave, or other type of continuous alternating wave, as long as it has upper and lower limits or peaks with respect to a reference value which may or may not be zero voltage. The pulses B are quite short relative to the time interval between successive pulses, and are negative-going with a peak amplitude of 15 volts, for example. As an example, the pulse width may be one microsecond and the pulse repetition frequency may be 8,000 pulses per second. The waveforms A and B are nominally of the same frequency (that is, the frequency of square wave A is nominally equal to the pulse repetition frequency of pulses B), but it is desired to determine the magnitude and sense of the phase difference, from an assumed "zero phase" condition, existing between the respective waveforms (voltages) A and B. "Zero phase" is assumed to correspond with the negative-going transition of the square wave, as indicated on waveform A in FIG. 1.

For purposes of ilustration, the phase comparator will be described in an automatic phase confrol (sometimes termed an automatic frequency control or AFC) system for an oscillator, in a time division multiplex receiver. In such a receiver, an oscillator is used for "gating on" the various multiplex channels in time sequence. This oscillator must be maintained in the proper time relation to the various elements of the incoming multiplex signal, ordinarily by means of an automatic phase control or synchronization system operating to lock the receiver oscillator in phase with synchronizing pulses transmitted from the remote transmitter and received at the receiver.

The phase comparator in FIG. 1 may therefore be part of the automatic phase control system just referred to. The pulses B may be synchronizing pulses which are transmitted from the transmitter along with the time division multiplex signal, and at the receiver are received, separated out in any conventional manner, and applied to input lead 2 of the phase comparator. The voltage waveform A (which is applied to input lead 1 of the phase comparator) is representative of the output of a controlled oscillator 4, and is derived from a square wave voltage generator 5, which supplies square wave output through an isolation amplifier 6 and over a resistor 7 (to be referred to further hereinafter) to input lead 1. The voltage generator 5 is driven by the output of oscillator 4, and the former operates, in effect, to convert the output of such oscillator to a square wave of the same frequency. The main portion of the output of oscillator 4 is supplied to a suitable utilization circuit, such as a gating arrangement for the various channels of a multiplex receiving equipment. The precise frequency of operation of the controlled oscillator 4 may be controlled by a suitable control device (not shown) included in the frequency-determining circuit of the oscillator 4. The automatic phase control of this oscillator may be effected by applying the output of the phase comparator to this control device for oscillator 4, as will be appreciated from the description which follows.

The phase comparator circuit comprises two junction transistors 8 and 9, both of the P-N-P type, for example of the type known as GT-153. The transistor 8 has an emitter electrode 10, a base electrode 11, and a collector electrode 12, while the transistor 9 has an emitter electrode 13, a base electrode 14, and a collector electrode 15. The emitter-collector paths of these two asymmetrical transistors are connected in reverse parallel relation, with the emitter 10 of transistor 8 and the collector 15 of transistor 9 being connected together and to phase comparator input lead 1, and the collector 12 of transistor 8 and the emitter 13 of transistor 9 being connected together and to phase comparator output lead 3. The base 11 of transistor 8 and the base 14 of transistor 9 are connected together and through a coupling capacitor 16 (capacitance value 120 mmfd., for example) to phase comparator input lead 2. A resistor 17 is connected across capacitor 16, to permit D.C. biasing of the base electrodes 11 and 14 to a potential other than zero. By means of the aforesaid connections, the synchronizing pulses B are applied to the base electrodes of both transistors in parallel, while the alternating voltage A (square wave) is applied to emitter electrode 10 and collector electrode 15 in parallel.

A storage capacitor 18, of rather large capacitance value (e.g., 0.1 mfd.), is connected from phase comparator output lead 3 to ground, and it is the voltage across this capacitor which may be considered as the phase comparator output voltage. The amplitude of the synchronizing pulse B must exceed that of the alternating voltage A. As a typical example, the peak-to-peak amplitude voltage of A may be slightly in excess of six volts, while the synchronizing pulse amplitude may be 15 volts, as indicated in FIG. 1.

The base potential of the synchronizing pulses B (that is, the voltage level between pulses) is positive with respect to ground. Between pulses, then, this positive D.C. potential is effective on base electrodes 11 and 14, due to the presence of resistor 17. This positive D.C. potential has such a value that, between pulses, the potential at base electrodes 11 and 14 is more positive than the maximum potential at emitter 13 (i.e., the maximum positive charge on capacitor 18) and the maximum potential at emitter 10 (i.e., the maximum positive value of alternating voltage A). If this is the case, between sampling periods, or in other words between synchronizing pulses B, there is established a "reverse" bias between the base and emitter of both transistors. Under conditions of such "reverse" bias,, there is substantially no current flow in the emitter-collector path of a transistor, so that both emitter-collecor paths 10, 12 and 15, 13 are in effect very high impedance, or broken. Considering the transistors 8 and 9 as switches, they are then open. Thus, between synchronizing pulses, there is in effect substantially an open circuit (via both transistors) between the upper or ungrounded plate of capacitor 18 and lead 1. No flow of current between the alternating voltage source (represented by waveform A) and capacitor 18 can occur between synchronizing pulses, so that no charging or discharging of such capactior can occur between synchronizing pulses. The charging path for capacitor 18 is then broken.

During each negative-going synchonizing pulse B, the potential at bases 11 and 14 is more negative than the minimum potential at emitter 13 and the minimum potential at emitter 10 (since the synchronizing pulse amplitude exceeds that of the alternating voltage A). Then, there is established a "forward" bias between the base 11 and emitter 10 of transistor 8, and also between the base 14 and emitter 13 of transistor 9. Under conditions of such "forward" bias, a substantial current may flow in the emitter-collector path of a transistor, the particular transistor conducting during the sampling period, and the amount of current flowing, depending upon the instantaneous voltage differences between the respective collector and emitter of each transistor. During sampling or synchronizing pulses, then, both transistors 8 and 9 are biased to have low impedances between collector and emitter. Considering the transistors as switches, they are then closed. Two symmetrical charging (or discharging) paths are thus set up, through the transistors 8 and 9, between capacitor 18 and the alternating voltage source (generator 5, whose output is represented by A). During the negative-going synchronizing pulses B, current flows through one or the other transistor from voltage source A to charge capactior 18 to a potential whose magnitude (and also, possibly, polarity) are uniquely determined by that portion of the cyclic output voltage A which appears on lead 1 during these same synchronizing pulses.

It may now be apparent that the value and polarity of the potential across capacitor 18 will depend upon the phase relation between the synchronizing pulses B and the alternating voltage A, that is, upon what portion of the alternating voltage A occurs at lead 1 during the brief period when synchronizing pulse B appears at bases 11 and 14. An example may help to make this clearer.

If the capacitor 18 is discharged, i.e., if there is a potential of zero volts thereacross, and if voltage A has a value of six volts negative when a synchronizing pulse B supplies a "forward" bias to transistors 8 and 9 to switch them "on" or set up the charging paths, transistor 8 does not conduct because its emitter 10 (potential six volts negative) is negative with respect to its collector 12 (potential zero volts). However, transistor 9 is in saturation under these conditions, because its emitter 13 (potential zero volts) is positive with respect to its collector 15 (potential six volts negative). The capacitor 18 is then charged through transistor 9 during the synchronizing or sampling pulse interval, to a potential of six volts negative, which is the value of voltage A at that instant. During the synchronizing pulse period, the switching-type transistors 8 and 9 and the phase comparator are "on," while between synchronizing pulses these transistors are "off."

To take another example, if the capacitor 18 is charged to a potential of six volts negative in the above manner, and if voltage A has a value of zero volts when a synchronizing pulse B supplies a "forward" bias to transistors 8 and 9 to switch them "on," transistor 9 does not conduct because its emitter 13 (potential six volts negative) is negative with respect to its collector 15 (potential zero volts). However, transistor 8 is in saturation under these conditions, because its emitter 10 (potential zero volts) is positive with respect to its collector 12 (potential six volts negative). The capacitor 18 is then discharged through transistor 8 during the synchronizing or sampling pulse period, to a potential of zero volts, which is the value of voltage A at that instant.

Summarizing the foregoing, it may be seen that the phase comparator described is basically a high speed switch (turned "on" by synchronizing pulses B) which allows current to flow in either direction, depending upon the existing potential difference across the switch (that is, the difference between the potential of capacitor 18 and the instantaneous potential of A.) If the capacitor potential is higher than that of the source A at this instant, a discharge current will flow. If the source potential is higher than that of the capacitor when the switch is closed, the capacitor will charge up. Discharging of the capacitor is effected through one of the transistors, while charging is effected through the other of the transistors.

The voltage across capacitor 18 is coupled to the phase comparator output terminal 19 through an impedance changing and D.C. translating network. Said network comprises two transistors 20 and 21 (for example, of the TI–905, N-P-N type) connected as D.C.-coupled cascaded emitter follower stages, with the emitter load of the first transistor 20 being constituted by the second emitter follower transistor 21. The circuitry of these cascaded emitter followers is quite conventional, so will not be described in detail.

The phase comparator output voltage, appearing at terminal 19, is applied to the control device for controlled oscillator 4 in such a way that the error voltage produced at the output of the phase comparator corrects the phase of the output of oscillator 4 to bring the phase of waveform A into the desired "zero phase" relation with the synchronizing pulses B. When this "zero phase" relation exists (that is, when the synchronizing pulse B occurs at the negative-going transition of the square wave A), a predetermined or desired voltage (not necessarily zero volts) appears across capacitor 18. The automatic phase control system operates in such a way that the error voltage produced at the output of the phase comparator (that is, the potential developed across the capacitor 18), applied to the control device for the controlled oscillator 4, varies the phase (or frequency) of oscillator 4 to reduce this error voltage, and to eventually bring such error voltage to the predetermined or desired voltage corresponding to the "zero phase" relation between waveform A and synchronizing pulses B. This is the well-known, standard action of an AFC or APC loop.

The foregoing completes the description of the switching-type transistorized phase comparator. The variable time constant network feature of the invention will now be described. A pair of diodes 22 and 23 (for example, of the T9G type) have opposite electrodes connected to lead 1. That is, the anode of diode 22 and the cathode of diode 23 (denoted by the symbol K) are both connected to phase comparator input lead 1. The cathode K of diode 22 is biased to a fixed D.C. voltage $E_1$, while the anode of diode 23 is biased to a fixed D.C. voltage $E_2$. Although the voltage $E_1$ is illustrated as being zero or ground, this does not need to be the case, and this voltage may be established at some other value which is either positive or negative with respect to ground. However, it is essential that the voltage $E_2$ be less than (or more negative than) the voltage $E_1$. Also, the difference between $E_1$ and $E_2$ must be smaller than the peak-to-peak amplitude of the output A from the isolation amplifier 6 and resistor 7, as indicated adjacent this waveform. For example, if the difference between $E_1$ and $E_2$ is six volts, as indicated on waveform A, then the peak-to-peak amplitude of voltage A should be at least slightly in excess of six volts, although it may be considerably in excess of six volts, if so desired. Although the voltages $E_1$ and $E_2$ are illustrated as being derived from a battery 24, they can be derived from any other suitable unidirectional (D.C.) source, such as a power supply.

The D.C. voltages $E_1$ and $E_2$ can be of the same, or of opposite, polarity. The only requirements are that the upper amplitude level (peak) of the square wave A be sufficiently large to overcome $E_1$ and cause diode 22 to conduct, and that the lower amplitude level (peak) of the square wave A be sufficiently low to overcome $E_2$ and cause diode 23 to conduct. In other words, during each half cycle of the square wave A, one or the other diode is made to conduct. As the input waveform A varies from its lower to its upper value, diode 23 conducts (since the lower peak of voltage A is sufficient to overcome $E_2$) until the positive-going transition of waveform A is reached. During either the positive-going or the negative-going transitions, while voltage A is between the $E_2$ and $E_1$ values, neither diode conducts, since neither $E_2$ nor $E_1$ is overcome during these transitions. After the transition time, when input waveform A reaches its upper value, diode 22 conducts (since the upper peak of voltage A is sufficient to overcome $E_1$) until the negative-going transition of waveform A is reached.

To summarize the foregoing, during the negative peaks of waveform A (which go below the $E_2$ value) diode 23 conducts, during the positive peaks of waveform A (which go above the $E_1$ value) diode 22 conducts, while neither diode conducts during the positive-going and negative-going transitions.

The conduction of either diode (22 or 23) causes the effective source resistance (which source, it will be remembered, charges capacitor 18 when the "switch" of the phase comparator is closed by the synchronizing pulse B) to be reduced to the value of the diode resistance, which latter is very low when the diode is in the forward conducting region. This may become apparent from a consideration of the following, taken in conjunction with FIG. 2, which is an equivalent circuit diagram of the arrangement of the invention during the negative peaks of waveform A, when diode 23 is conducting. In this figure, the resistance $R_0$ represents the resistance of amplifier 6 plus that of resistor 7, which latter may have a value of 470 ohms, for example. The phase comparator is represented by a switch 25 (which is closed during synchronizing pulses B, as previously described) and a resistance R, which is very low, the capacitor 18 being charged through the phase comparator from the source when the switch 25 is closed, as previously described.

When diodes 22 and 23 are not conducting (which, as previously described, occurs during the positive-going and negative-going transitions of voltage A), and if switch 25 is in effect then closed by the synchronizing pulses B, the equivalent time constant for the condenser charging path (or for the phase comparator) is $(R+R_0)C$, where C is the capacitance of capacitor 18. This is because the shunt arm 23, 24 is out of the picture, in effect, when the diodes are not conducting.

When the diode 23 (or likewise the diode 24) is conducting, it has a small resistance. If this latter resistance is small compared with $R_0$, the equivalent source resistance is determined by the diode resistance $R_D$. This results from Thévenin's Theorem, which states that any linear network containing one or more sources of voltage and having two terminals behaves, insofar as a load impedance (such as C, 18 in the present case) connected across the terminals is concerned, as though the network and its generators were equivalent to a simple generator having an internal impedance Z and a generated voltage E, where E is the voltage that appears across the terminals when no load impedance is connected (which voltage E would be approximately $E_2$ in the present case, during the negative peaks of voltage A) and Z is the impedance that is measured between the terminals when all sources of voltage in the network are short-circuited (which impedance Z would be $R_D$ in the present case, since $R_D$ is much smaller than the parallel-connected resistance $R_0$).

Thus, for the negative peaks of voltage A (and likewise for the positive peaks of voltage A, but with the opposite battery polarity), the equivalent circuit diagram is as illustrated in FIG. 3. Since $R_D$ is approximately zero and the source voltage is approximately $E_2$ (or $E_1$ for the positive peaks of voltage A), it can be seen that when diodes 22 and 23 are conducting, the source resistance (which charges capacitor 18 when the synchronizing pulses B close switch 25) is very low. If $R_D$ is much smaller than R, it can be disregarded, so that when switch 25 is closed, that is, when the synchronizing pulse is prsent, and if diodes 22 or 23 are conducting, the equivalent time constant for the condenser charging path (or for the phase comparator) is simply RC, which is much smaller than $(R+R_0)C$, the equivalent time constant when diodes 22 and 24 are not conducting. If diodes 22 or 23 are conducting, then, the capacitor 18 must charge to $E_1$ or $E_2$ during the time the synchronizing pulse is present (that is, during the time switch 25 is closed).

As previously explained, if neither diode is conducting, the total series resistance is $R+R_0$. This non-conduction condition of the diodes occurs during both the positive-going and negative-going transitions of voltage A. Then, the effective source resistance is $R_0$, which is much higher than the source resistance $R_D$ when diode conduction takes place. Another way of stating this is that the equivalent time constant for charging capacitor 18 (assuming the phase comparator switch 25 is closed) is $(R+R_0)C$ when the diodes are not conducting, and this time constant is much greater than the time constant RC when the diodes are conducting.

Summarizing the operation of the invention, if the synchronizing pulse B exists (closing the "switch" of the phase comparator) during the time either diode 22 or 23 is conducting at the positive or negative peaks of voltage A, the charging time constant is very short and the capacitor 18 charges or discharges very rapidly to the clamped (diode biasing) voltage $E_1$ or $E_2$, as the case may be. Then, a low resistance charging path is established for the capacitor 18. When a synchronizing pulse B occurs during the transitions of voltage A (as for example at the "zero phase" negative-going transition), neither diode is conducting and the source resistance increases to the value $R_0$, which is the resistance of resistor 7 plus the amplifier 6 resistance. So, under the latter conditions, a high resistance (long time constant) charging path is established for the capacitor 18.

The language "alternating current" or "alternating voltage" appearing in the description and claims is deemed to include any varying voltage whose peak values are above and below a reference value which may or may not be zero.

What is claimed is:

1. In combination, a high impedance source of alternating voltage, a capacitor adapted to be charged under control of said source, a switching-type phase comparator having two inputs and an output; a coupling between one of said inputs and the output of said source, means connecting said capacitor to the output of said phase comparator, said coupling comprising two biased diodes, one of said diodes connected across said source and said capacitor, the other of said diodes connected in opposite polarity to said one diode across said source and said capacitor, means for applying switching pulses to the other input of said phase comparator thereby to close the switch of said phase comparator to charge said capacitor to a potential equal to the value of said voltage at the instant of closure of said switch, and two biased diodes, one of said diodes being biased to conduct at the times of occurrence of the positive peaks of said alternating voltage and the other of said diodes being biased to conduct at the times of occurrence of the negative peaks of said alternating voltage.

2. Automatic frequency control apparatus comprising an oscillator to be controlled, a phase comparator having two inputs and an output, a connection from said oscillator to one of said inputs of said phase comparator, said connection including lumped electrical resistance, means for supplying short reference pulses to said second input of said phase comparator, a storage capacitor connected to said output of said phase comparator, a pair of diodes each having a cathode and an anode, the cathode of one of said diodes and the anode of the other of said diodes being connected to said connection between said lumped electrical resistance and said phase comparator, a voltage source having a voltage value less than the peak to peak voltage of the output of said oscillator connected between said anode of said one diode and said cathode of said other diode, and a connection from said voltage source to said storage capacitor opposite the connection thereof to said phase comparator output.

3. Automatic frequency control apparatus comprising an oscillator to be controlled, a square wave generator receiving the output of said oscillator to provide a square wave in step with the output of said oscillator, a phase comparator having two inputs and an output, a connection from said square wave generator to said one of said inputs of said phase comparator, said connection including lumped electrical resistance, means for supplying short reference pulses to said second input of said phase comparator, a storage capacitor connected to said output of said phase comparator, a pair of diodes each having a cathode and an anode, the cathode of one of said diodes and the anode of the other of said diodes being connected to said connection between said lumped electrical resistance and said phase comparator, a voltage source having a voltage value less than the peak to peak voltage of the output of said square wave generator connected between said anode of said one diode and said cathode of said other diode, and a connection from said voltage source to said storage capacitor opposite the connection thereof to said phase comparator output.

4. Automatic frequency control apparatus comprising an oscillator to be controlled, a square wave generator receiving the output of said oscillator to provide a square wave in step with the output of said oscillator, a phase comparator having two inputs and an output, a connection from said square wave generator to said one of said inputs of said phase comparator, said connection including lumped electrical resistance, means for supplying short reference pulses to said second input of said phase comparator, a storage capacitor connected to said output of said phase comparator and to said square wave generator, a pair of biased diodes connected to said one input at a point between said lumped electrical resistance and said phase comparator and to said connection of said storage capacitor to said square wave generator.

5. In combination, a high impedance source of voltage which varies between upper and lower limits, a capacitor included in a charging circuit to said source, a switching device in said circuit between said source and said capacitor, means for closing said switching device periodically to charge said capacitor to a potential equal to the value of said voltage at the instant of closure of said switch, and two diodes, one of said diodes connected from said source across said capacitor, means to apply a bias voltage to said diodes whereby said diode conducts at the times of occurrence of the upper limit of said voltage, the other of said diodes being opppositely connected from said source across said capacitor, means to apply a bias voltage to said other diode whereby said other diode conducts at the times of occurrence of the lower limits of said voltage, said bias voltage on said other diode being less than said bias voltage on said one diode and said bias voltage difference being smaller than the range between said upper and lower limits.

References Cited in the file of this patent

UNITED STATES PATENTS

| | | |
|---|---|---|
| 2,666,136 | Carpenter | Jan. 12, 1954 |
| 2,676,262 | Hugenholtz | Apr. 20, 1954 |
| 2,705,282 | Parode | Mar. 29, 1955 |
| 2,730,616 | Bastow | Jan. 10, 1956 |
| 2,763,779 | De Groot | Sept. 18, 1956 |
| 2,774,872 | Howson | Dec. 18, 1956 |
| 2,812,435 | Lyon | Nov. 5, 1957 |
| 2,820,143 | D'Nelly | Jan. 14, 1958 |
| 2,828,419 | Gruen | Mar. 25, 1958 |
| 2,868,975 | Harris | Jan. 13, 1959 |
| 2,912,651 | Leeds | Nov. 10, 1959 |
| 2,932,793 | Smith | Apr. 12, 1960 |